United States Patent [19]
Eichelberger et al.

[11] Patent Number: 4,760,289
[45] Date of Patent: Jul. 26, 1988

[54] TWO-LEVEL DIFFERENTIAL CASCODE CURRENT SWITCH MASTERSLICE

[75] Inventors: Edward B. Eichelberger, Hyde Park; Stephen E. Bello, Kingston; Rolf O. Bergenn, West Hurley; William M. Chu, Hyde Park; John A. Ludwig, Woodstock; Richard F. Rizzolo, Red Hook, all of N.Y.

[73] Assignee: International Business Machines Corporation, Armonk, N.Y.

[21] Appl. No.: 893,061

[22] Filed: Aug. 4, 1986

[51] Int. Cl.$^4$ .................. H03K 19/177; H03K 19/086
[52] U.S. Cl. ..................................... 307/455; 307/465; 307/467; 307/303; 357/45
[58] Field of Search ............ 357/34, 45; 307/443, 307/455, 465–467, 471, 475, 480, 243, 272 R, 303

[56] References Cited

U.S. PATENT DOCUMENTS

| | | | |
|---|---|---|---|
| 3,999,214 | 12/1976 | Cass | 357/41 X |
| 4,249,193 | 2/1981 | Balyoz et al. | 357/45 X |
| 4,354,266 | 10/1982 | Cooperman et al. | 307/243 X |
| 4,408,134 | 10/1983 | Allen | 307/467 X |
| 4,513,283 | 4/1985 | Leininger | 307/455 X |
| 4,585,957 | 4/1986 | Ooms | 307/455 |
| 4,670,673 | 6/1987 | Varadarajan | 307/455 |
| 4,686,392 | 8/1987 | Lo | 307/455 X |

*Primary Examiner*—Stanley D. Miller
*Assistant Examiner*—D. R. Hudspeth
*Attorney, Agent, or Firm*—J. Dennis Moore

[57] ABSTRACT

A masterslice cell wireable to form any of a selected book set of two level differential cascode current switch basic circuits. Twenty percent increased performance is provided as compared with ECL masterslice circuits running at the same power. In spite of increased wire due to differential logic, and potential increased complexity in design software, the invention is actually readily adaptable to existing masterslice design systems.

3 Claims, 20 Drawing Sheets

FIG.3
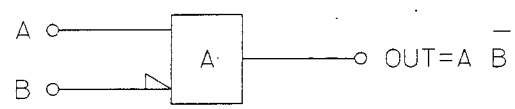
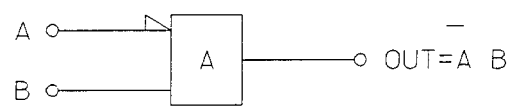
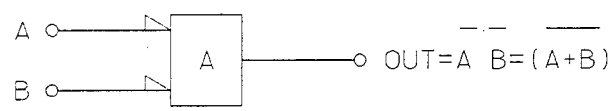
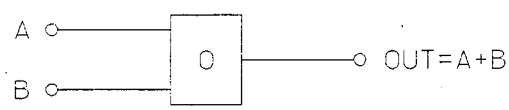
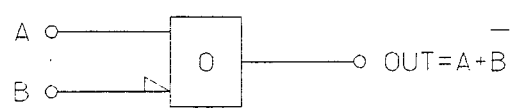
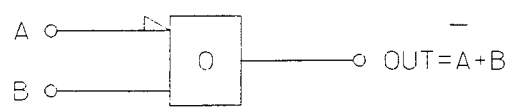
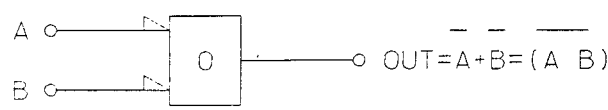

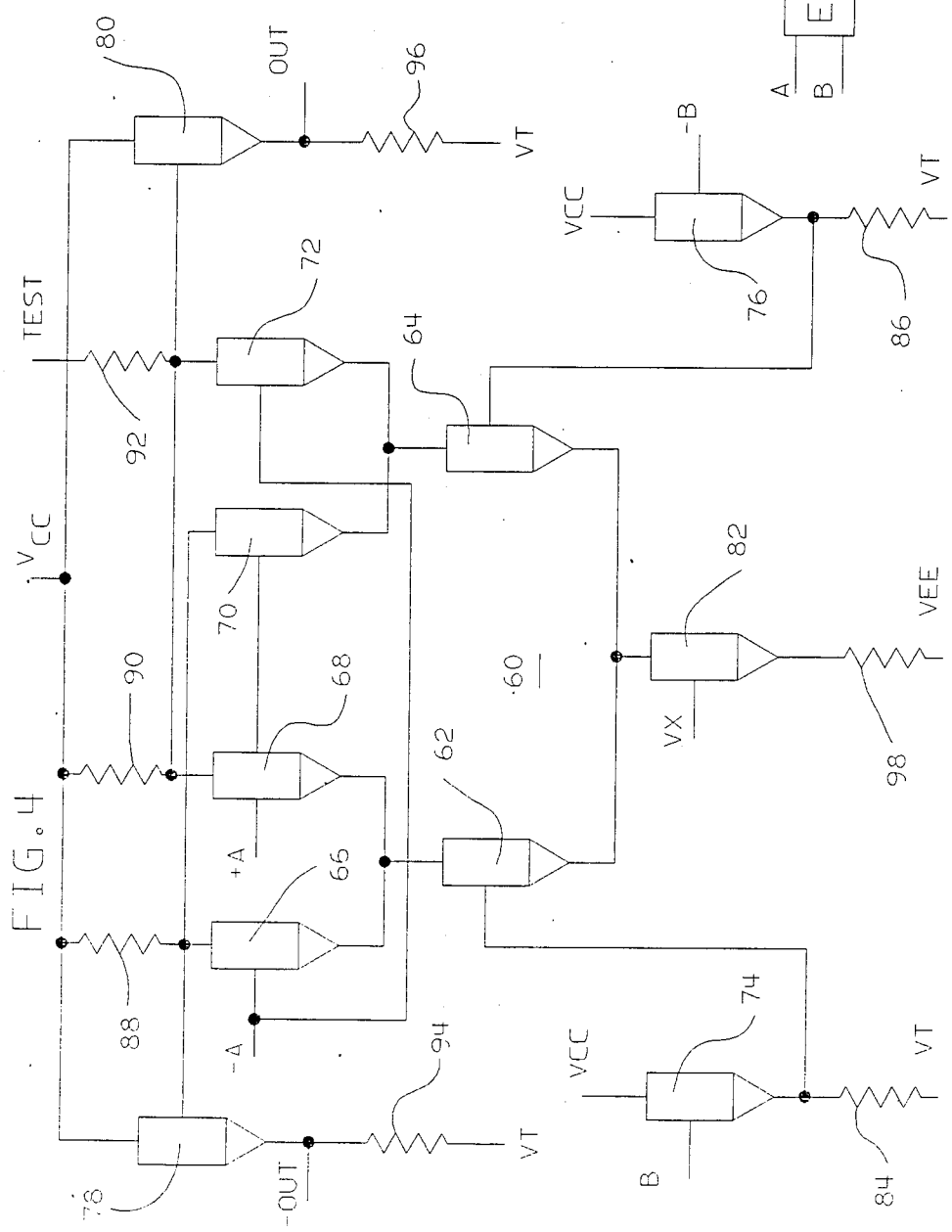

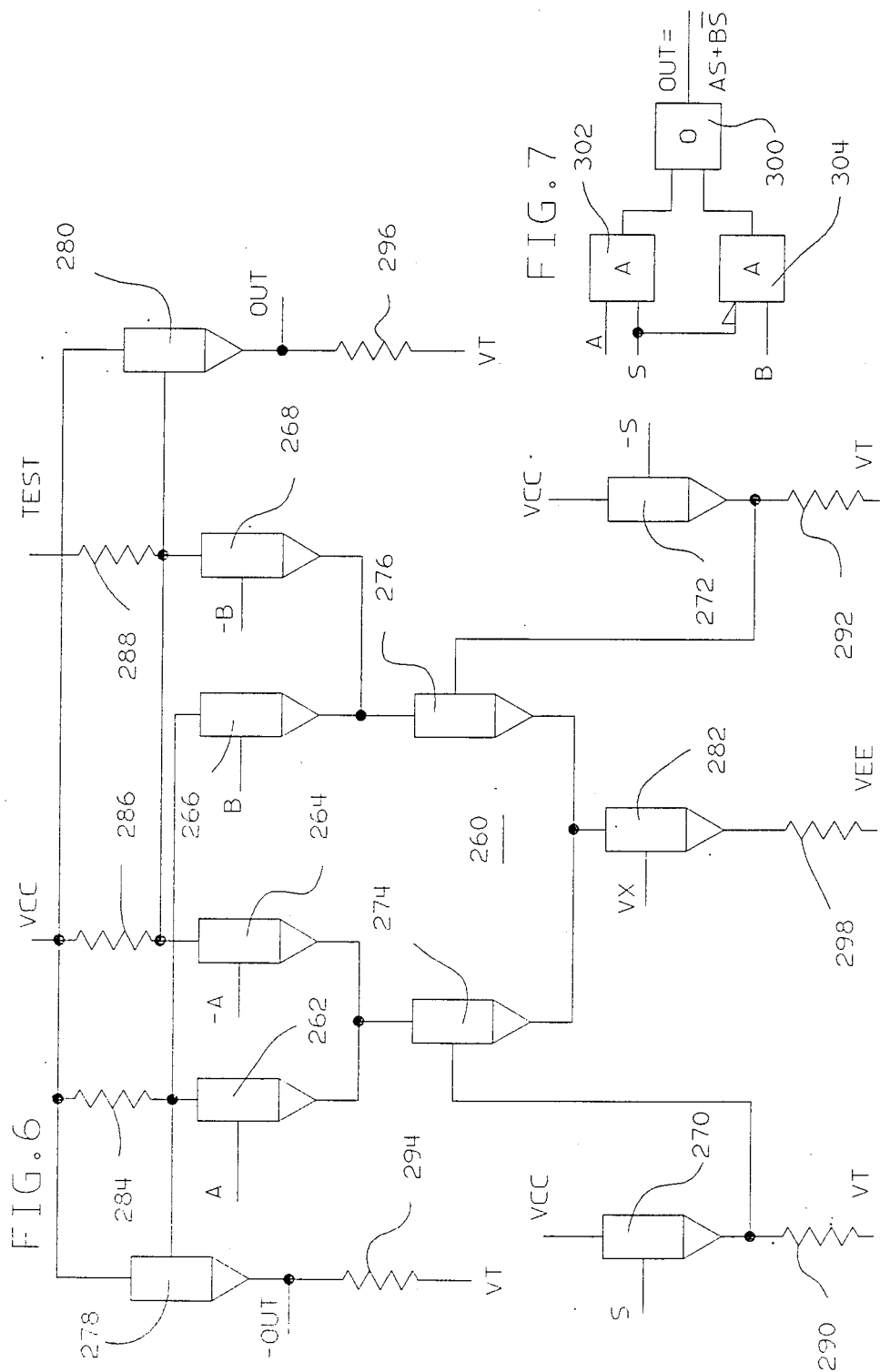

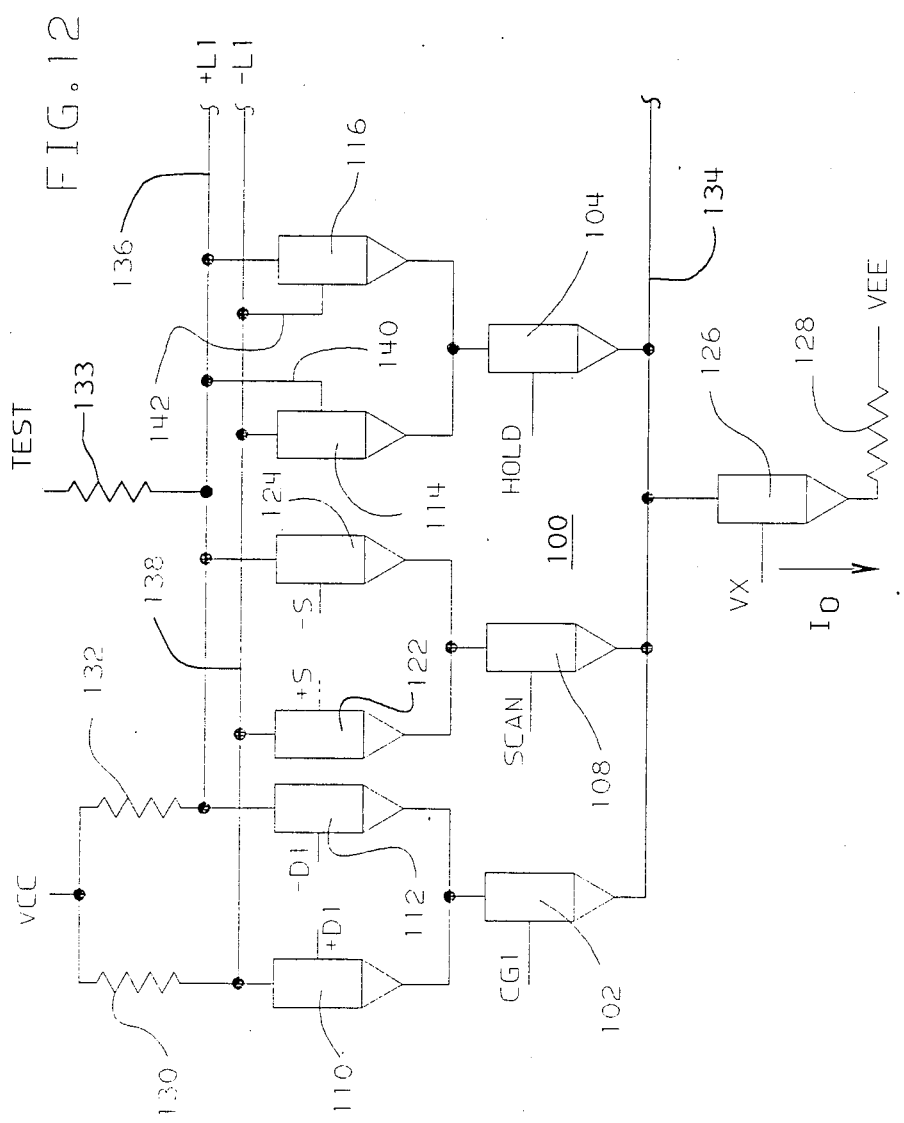

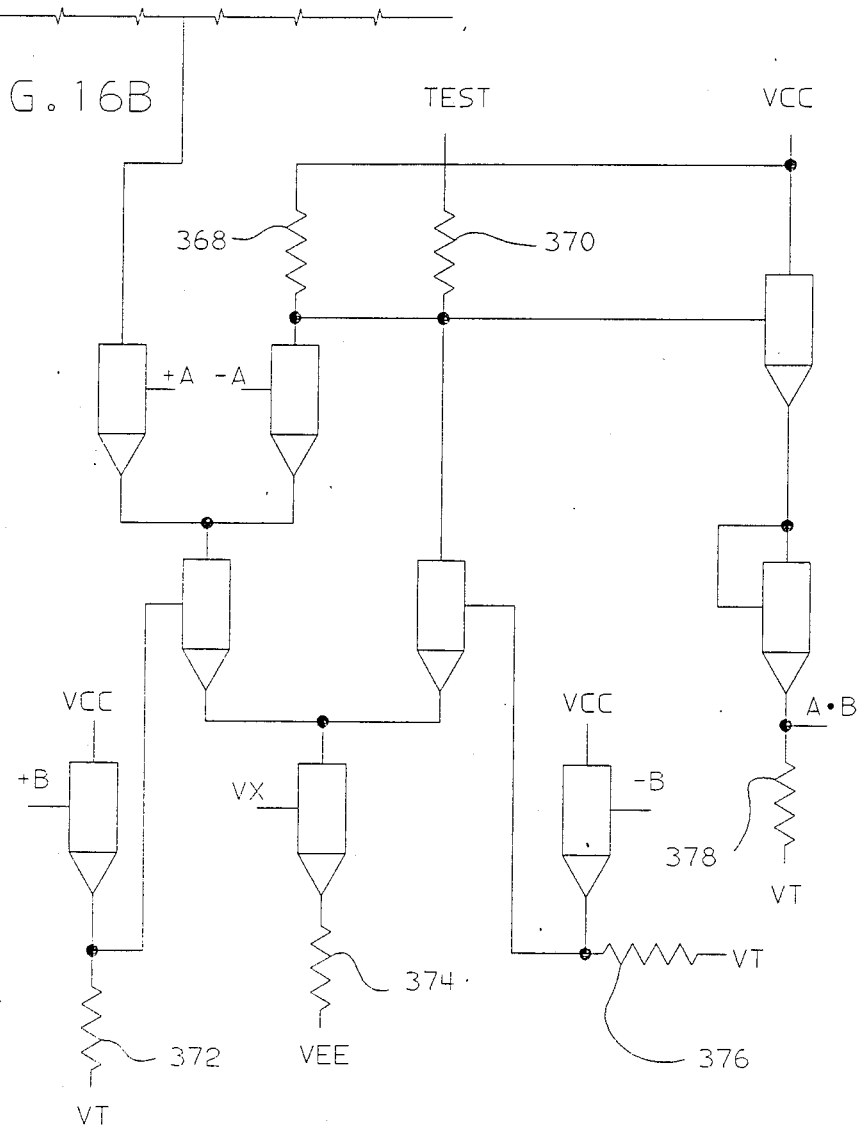

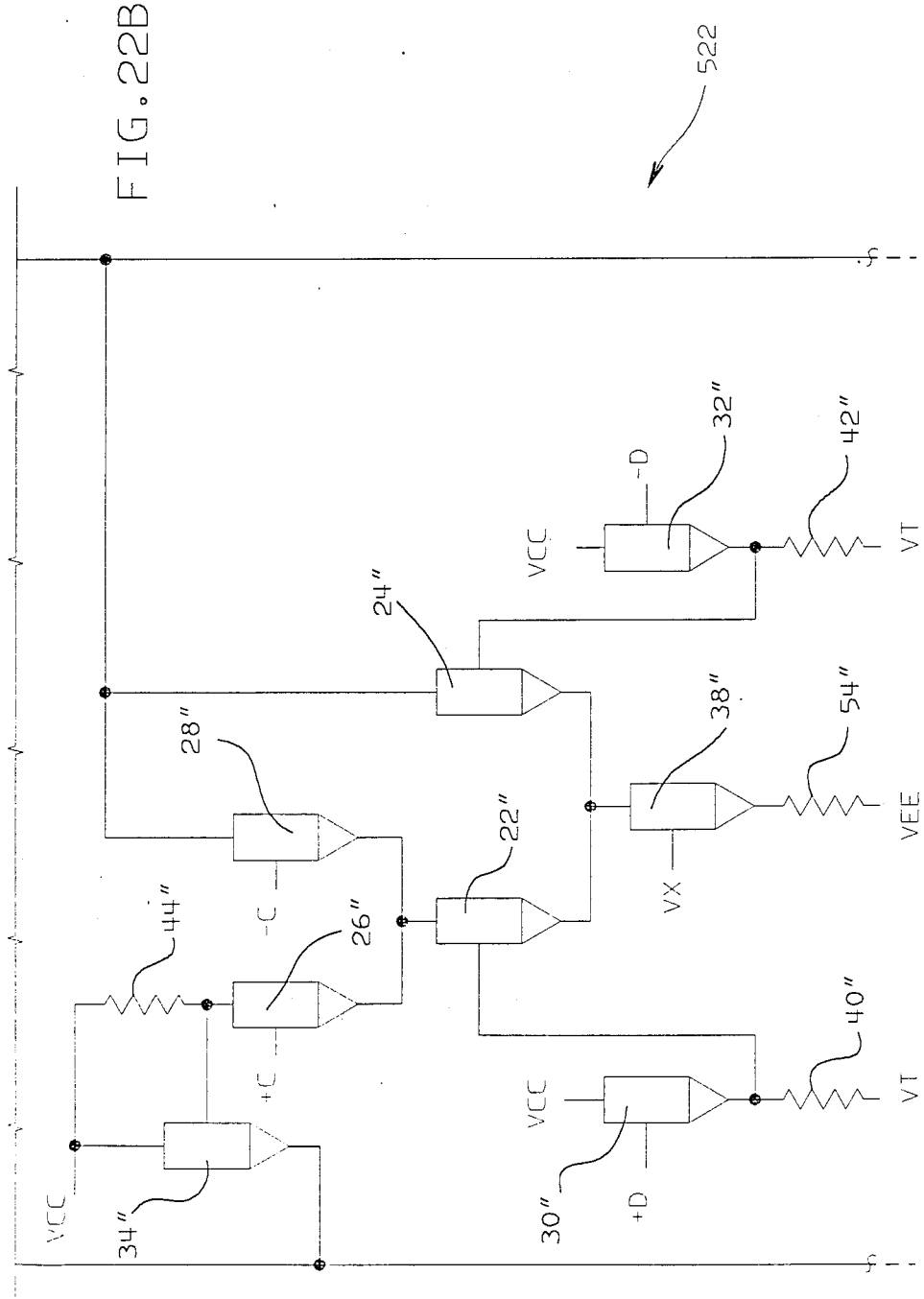

TWO-LEVEL DIFFERENTIAL CASCODE CURRENT SWITCH MASTERSLICE

INDEX

I. BACKGROUND OF THE INVENTION
  A. Field of the Invention
  B. Background Art
II. SUMMARY OF THE INVENTION
III. BRIEF DESCRIPTION OF THE DRAWINGS
IV. DESCRIPTION OF PREFERRED EMBODIMENT OF THE INVENTION
  A. General Description
  B. Detailed Logic Primitives Description
    1. Two-Way Multifunction Circuit
    2. Two-Way Exclusive OR Circuit
    3. Two-Way Selector
    4. Four-Way Selector
    5. L1 Latch
    6. L1 Clock Driver
    7. N-Way Selector Driver
    8. Internal Gated Buss Driver
    9. Off Chip Receiver Circuit
  C. Dot Function Connections
  D. Test Port
V. CLAIMS

I. BACKGROUND OF THE INVENTION

A. Field of the Invention

The present invention relates to automated VLSI design systems, and more particularly to such design systems in which the basic building block for design is a cell containing a physical pattern of devices that may be wired in any of several different ways to provide one of a set of "books" of basic logic functions, i.e., "masterslice" design systems.

B. Background Art

In the masterslice design approach, a great number of unit cells containing various circuit elements are formed and arranged on a substrate so as to be able to obtain a number of different LSI circuits making different interconnection metallization patterns. The masterslice design approach is useful in that the same diffusion mask, or masks, can be used to produce many different VLSI circuits merely by designing appropriate masks for the metallization of each LSI circuit. Providing interconnection metallization is the final fabrication step or steps in the process of producing LSI semiconductor devices.

The masterslice design approach for providing LSI semiconductor devices is well known to persons skilled in the art. Exemplary patents are U.S. Pat. No. 3,999,214, entitled "Wireable Planar Integrated Circuit Chip Structure" granted Dec. 21, 1976 to E. E. Cass and of common assignee herewith; and U.S. Pat. No. 4,249,193, entitled "LSI Semiconductor Device and Fabrication Thereof", granted Feb. 3, 1981 to J. Balyoz et al.

The masterslice design approach provides many advantages to automated design, especially in the computer industry. However, further improvement in VLSI chip design is desired. Two important problems in VLSI chip design are (1) global electrical design (power distribution, noise and signal IR drop), and (2) large circuit delays due to the high capacitance of internal nets. Emitter coupled Logic (ECL) circuits have been designed that reduce these problems. However, it is desired to obtain even greater performance (faster speed) and higher logic density in chips made according to the masterslice design approach.

It has been proposed to use the differential current switch (DCS) in the masterslice design approach. Attempts have been made to use the DCS circuit in the masterslice design methodology. Unfortunately, these previous attempts have not been successful. They have suffered from problems associated with design complexity, and have not demonstrated either performance or density advantages over conventional ECL logic.

A difficult aspect of DCS circuits to deal with in the masterslice area is that they are differential, that is, instead of a single line transporting a signal across a chip, two lines are required. This impacts density adversely. To compensate for this problem, it has been attempted to provide differential cascode current switch (DCCS) circuits, that is, differential current switch circuits having several different signal levels, that is, signals operating in different and distinct voltage ranges. It was thought that more device density per logic function could be achieved by this expedient. However, this was not proved out, the complexities of multilevel signals rendering computer aided masterslice design system programs overly complex for any practice application.

The present invention solves these problems. It has high switching speed (twenty or more percent greater than the speed of ECL circuits at the same power), and because of its logic power only about half the number of gates is needed to provide the same logic function as compared with ECL circuits. Thus, for the same logic function, the speed-power product is approximately two to three times better than that of ECL. In addition, the invention may be implemented through a set of fundamental circuits, or book set, comparable in size to that of conventional ECL masterslice, which provides a sufficient selection for most computer circuit design applications. It is, clearly, a significant advance in the masterslice design system art.

II. SUMMARY OF THE INVENTION

The present invention provides in a masterslice design system, a cell for replicated placements in an array on a semiconductor chip for subsequent wiring to form a VLSI circuit. The cell has a plurality of devices arranged so as to permit interconnection by metallization wiring to form any of a set of basic logic circuits for interconnection with other such wired cells on the same chip to form a larger circuit, the basic logic circuits being of the two level differential cascode current switch type. Three levels of wiring metal are used in the masterslice. The devices are arranged to permit at least one pair of the devices to be wired to form a pair of input translator circuits. The devices include characteristics selected to provide a signal swing having a magnitude of approximately 250 millivolts or less.

Using the invention, a set of circuits can be defined that effectively implements all typical data flow logic functions using conventional masterslice techniques. Such a circuit family will have substantially better performance than conventional alternatives, and will be extremely insensitive to noise, signal line IR drop and power distribution variation. These advantages may be obtained without a sacrifice of circuit density as compared with ECL having three levels of wiring metal. The circuits implemented in accordance with the present invention are quite effective in implementing data flow logic functions and control logic.

The foregoing and other objects, features and advantages of the invention will be apparent from the more particular description of the preferred embodiments of the invention, as illustrated in the accompanying drawings.

III. BRIEF DESCRIPTION OF THE DRAWINGS

FIG. 3 is a logic diagram for the circuit shown in FIG. 2.

FIG. 4 is a circuit diagram of a two-way Exclusive OR circuit.

FIG. 5 is a logic diagram for the circuit shown in FIG. 4.

FIG. 6 is a circuit diagram of a two-way selector circuit.

FIG. 7 is a logic diagram for the circuit shown in FIG. 6.

FIG. 12 is a circuit diagram for an L1 latch circuit.

In the drawings, like elements are designated with similar reference numbers, and identical elements in different specific embodiments are designated by identical reference numbers.

IV. DESCRIPTION OF PREFERRED EMBODIMENT OF THE INVENTION

A. General Description

According to the preferred embodiment of the present invention, the DCCS logic is implemented in a book set of nine logic primitives:

(1) Two-Way Multifunction Circuit
(2) Two-Way Exclusive OR Circuit
(3) Two-Way Selector
(4) Four-Way Selector
(5) L1 Latch
(6) L1 Clock Driver
(7) N-Way Selector Driver
(8) Internal Gated Buss Driver
(9) Off Chip Receiver Circuit All of these logic primitives are two level cascode DCCS circuits. All global chip signals are DCCS at the higher voltage level, with the exception of clock signals and gate signals which are one-out-of-N differential signal swings at a lower voltage level. Where the primitive DCCS circuits require lower level DCCS signals, a translation is provided on the input of the primitive. Off chip drivers have DCCS inputs, and off chip receivers have DCCS outputs. In fact, the driver is the same as used in ECL current switch, except that the input is DCCS. Otherwise, the embodiment described herein utilizes conventional masterslice design system features, for example, design system and software, and the processes for converting the masterslice design system data to actual VLSI chips. All circuits can operate on a single power supply. However, in the embodiment described herein, four power supply voltages are provided, $V_{CC}$, $V_R$, $V_{EE}$ and $V_T$. $V_{CC}$ is 1.4 volts, $V_{EE}$ is $-2.2$ volts and $V_T$ is $-0.7$ volts. These voltages are compatible with ECL circuits, and thus permit combining the invention with ECL, as desired.

Figure 1:
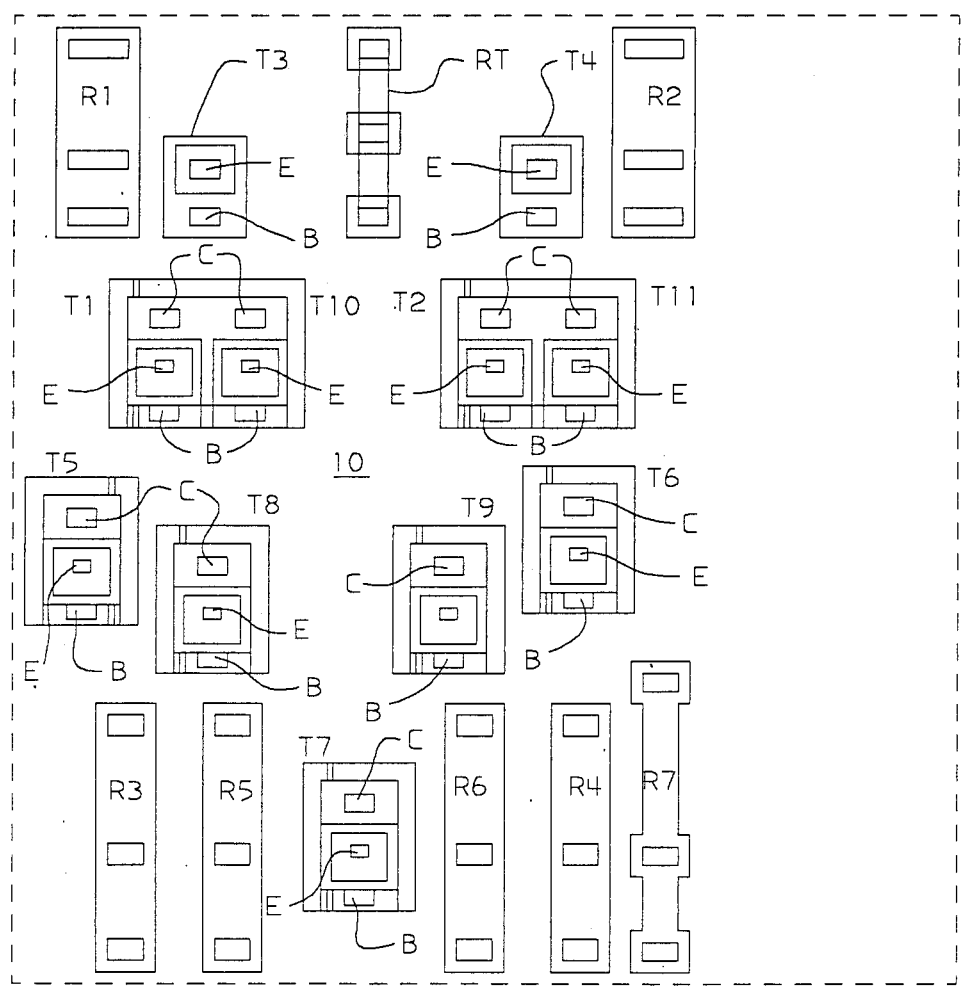
FIG. 1 is a diagram of an unwired masterslice cell according to the preferred embodiment of the present invention.

FIG. 1 depicts a basic unwired cell 10, having eleven transistors T1-T11, and nine resistors R1-R9 arranged to permit metallization wiring connections to form one of the aforementioned logic primitives. The collectors, emitters and bases of the transistors are identified by the letters C, E, and B, respectively. Formation of these resistive and transistor elements on a masterslice substrate is according to conventional and well known masterslice integrated circuit techniques. For example, the techniques described in U.S. Pat. No. 4,249,193, commonly assigned, may be employed to form these devices in the pattern shown.

Resistor values are as follows:

| | |
|---|---|
| R1 and R2 | Top: 552 ohm |
| | Bottom: 277 ohm |
| R3, R4, R5 and R6 | Top: 1421 ohm |
| | Bottom: 2840 ohm |
| R7 | Top: 954 ohm |
| | Bottom: 1908 ohm |
| RT | Top: 5520 ohm |
| | Bottom: 2770 ohm |

Note that a significant portion 12 of cell 10 contains no devices. This portion 12 is reserved for first level metallization global wiring. It is desirable to reserve such portion of a cell according to the present invention for first level metallization global wiring because DCCS uses differential signal lines—doubling the number of signal lines as compared with ECL current switch masterslice. The amount of additional space in a cell reserved for first level metallization global wiring is a function of total number of cells in the chip. As the number of cells increases, so does the amount of global wiring per cell.

Note also that all resistors have an intermediate tap point which permits selection among three different resistor values, depending upon whether the wiring connections are to the bottom two, top two or bottom and top tap points. This allows the designer to select a low, medium or high power circuit, depending upon the selected resistor values, with corresponding low, medium or high performance, respectively.

Diagrams depicting the first and second level metallization for the personalization of the cell shown in FIG. 1 for a typical logic primitive are presented below, following the detailed circuit description for that primitive. All of the logic primitives are described in detail in the text that follows. At the end of the Detailed Description of the Preferred Embodiment, a table provides the specific resistor values for each primitive.

B. Detailed Logic Primitives Description

1. Two-Way Multifunction Circuit

Figure 2:
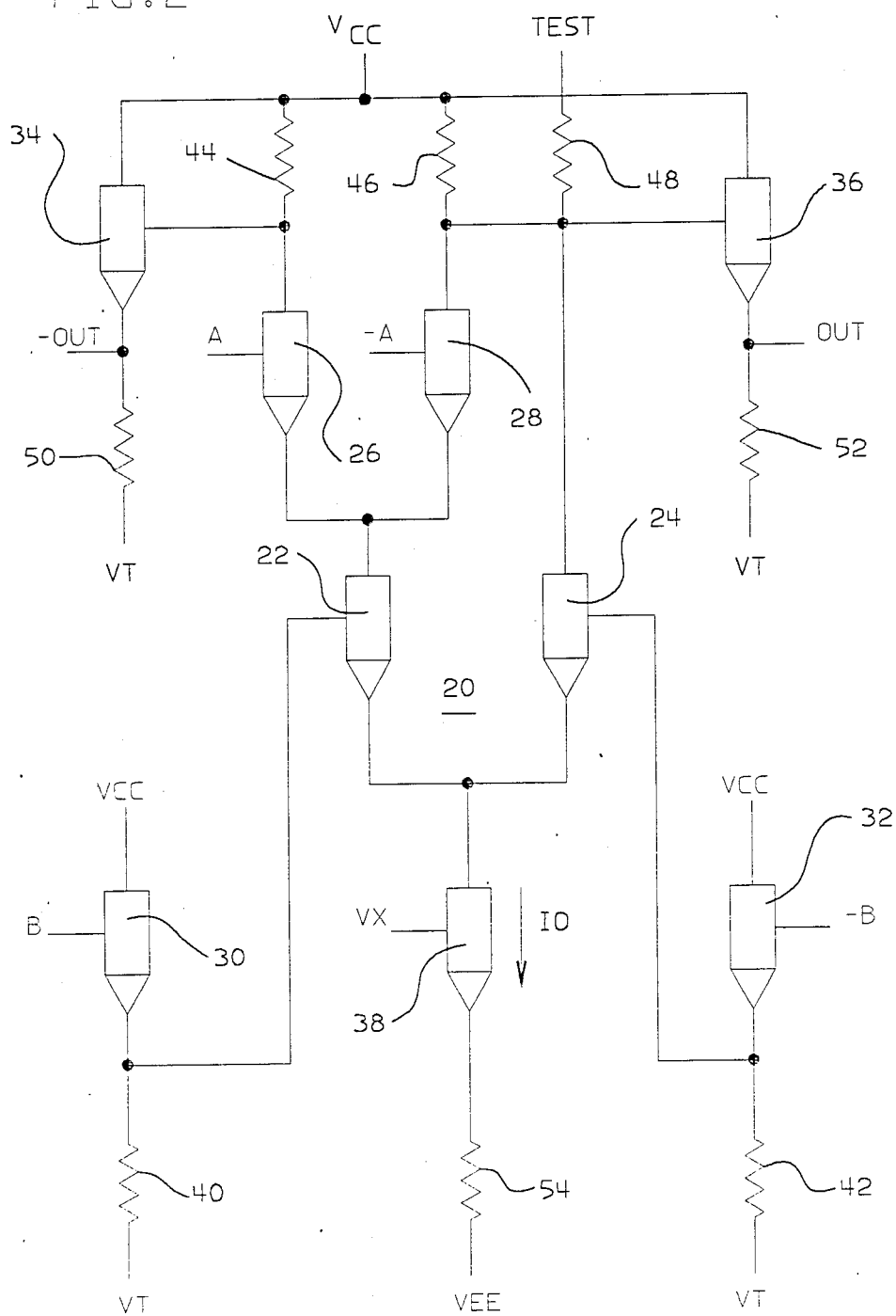
FIG. 2 is a circuit diagram of a two-way multi-function circuit.

The multi-function primitive logic block 20 is shown in FIG. 2. Both inputs and the output are DCCS signals and are of the same levels. When both +A and +B are positive, the current, $I_O$ of the current source comprising transistor 38 and resistor 54, flows through transistors 22 and 26 and resistor 44, causing −OUT to be at an up level and +OUT to be at a down level. The voltage difference between +OUT and −OUT equals $I_O R$, where IO equals the current flowing through current source transistor 38 and R equals the value of resistor 44 or resistor 46, which are substantially identical. Transistors 30 and 32 are emitter followers used to shift the DCCS input signals to the lower level of the cascode circuit.

Since inputs and output signals can be inverted by swapping the two wires of the signal pairs, eight different 2-input functions can be obtained from the multifunction circuit. These eight functions are shown in FIG. 3, and can be used for logic design and simulation.

2. Two-Way Exclusive OR

The DCCS two-way exclusive OR circuit is shown in FIG. 4. When +A is positive and +B is negative or when +A is negative and +B is positive, the current flows through R88 and +OUT is positive. The +B, −B input signals are translated to the lower DCCS level by the emitter followers transistors 74 and 76. FIG. 5 shows the logic function for the two-way exclusive OR circuit of FIG. 4.

The inverse of the exclusive OR function can easily be obtained by swapping the signal pairs of either of the two input variables or by swapping the output signal pairs.

3. Two-Way Selector

Multi-way selectors can be implemented using a DCCS circuit similar to the multi-port latch circuit. A two-way selector is shown in FIG. 6, with its logic function in FIG. 7. The circuit of FIG. 6 is identical to the exclusive OR circuit 60 shown in FIG. 4, except that input variables A and B are different, where they are the same in FIG. 4. Thus, transistors 262, 264, 266, 268, 270, 272, 274, 276, 278, 280, and 282, and resistors 284, 286, 288, 290, 292, 294, 296, and 298, correspond to transistors 66, 68, 70, 72, 74, 76, 62, 64, 78, 80, and 82, and resistors 88, 90, 92, 84, 86, 94, 96, and 98, respectively.

The two-way selector is possibly the most powerful DCCS circuit since it performs a two level logic function with a single stage DCCS logic circuit, and has no restrictions in its inputs. In digital processor applications this circuit is used extensively, along with the multi-function circuit (discussed below) and the exclusive OR circuit 60 (FIG. 4) in implementing random logic functions.

Figure 8:
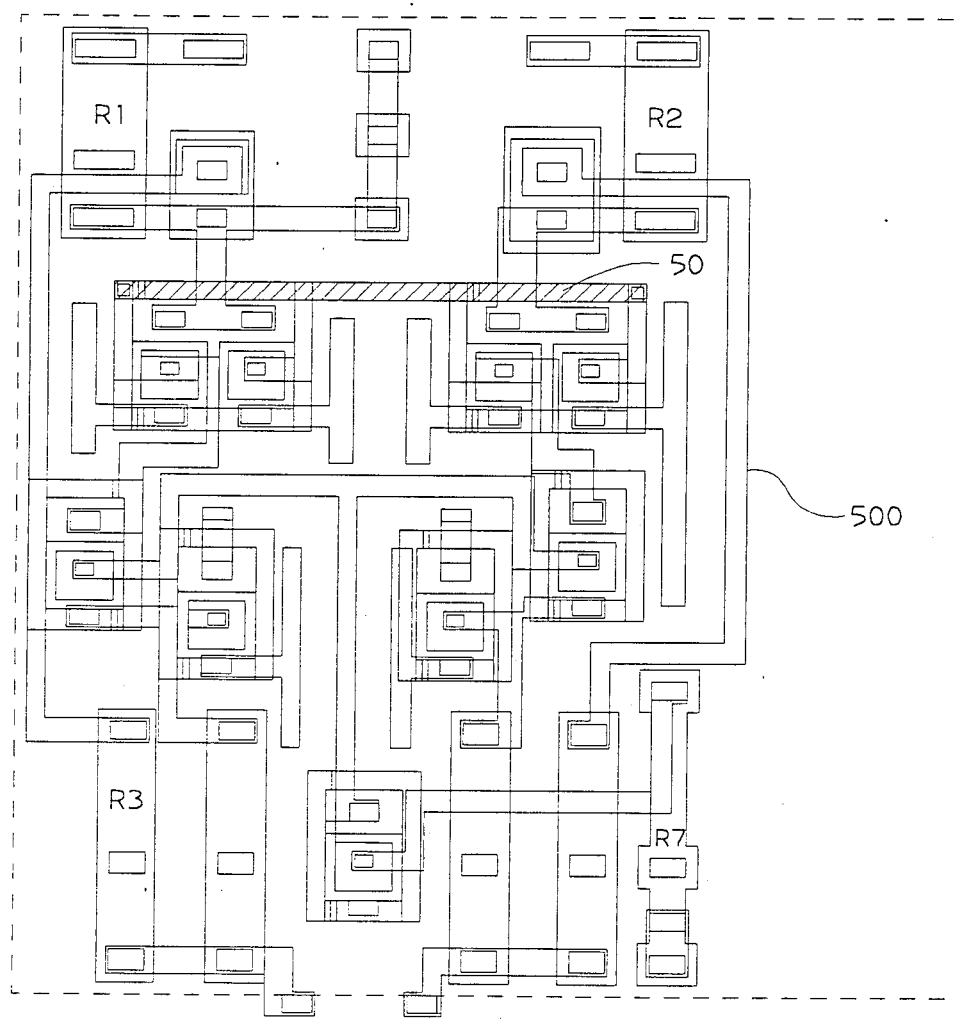
FIG. 8 is a diagram showing the cell of FIG. 1 with metallization forming a two-way selector circuit.
Figure 9:
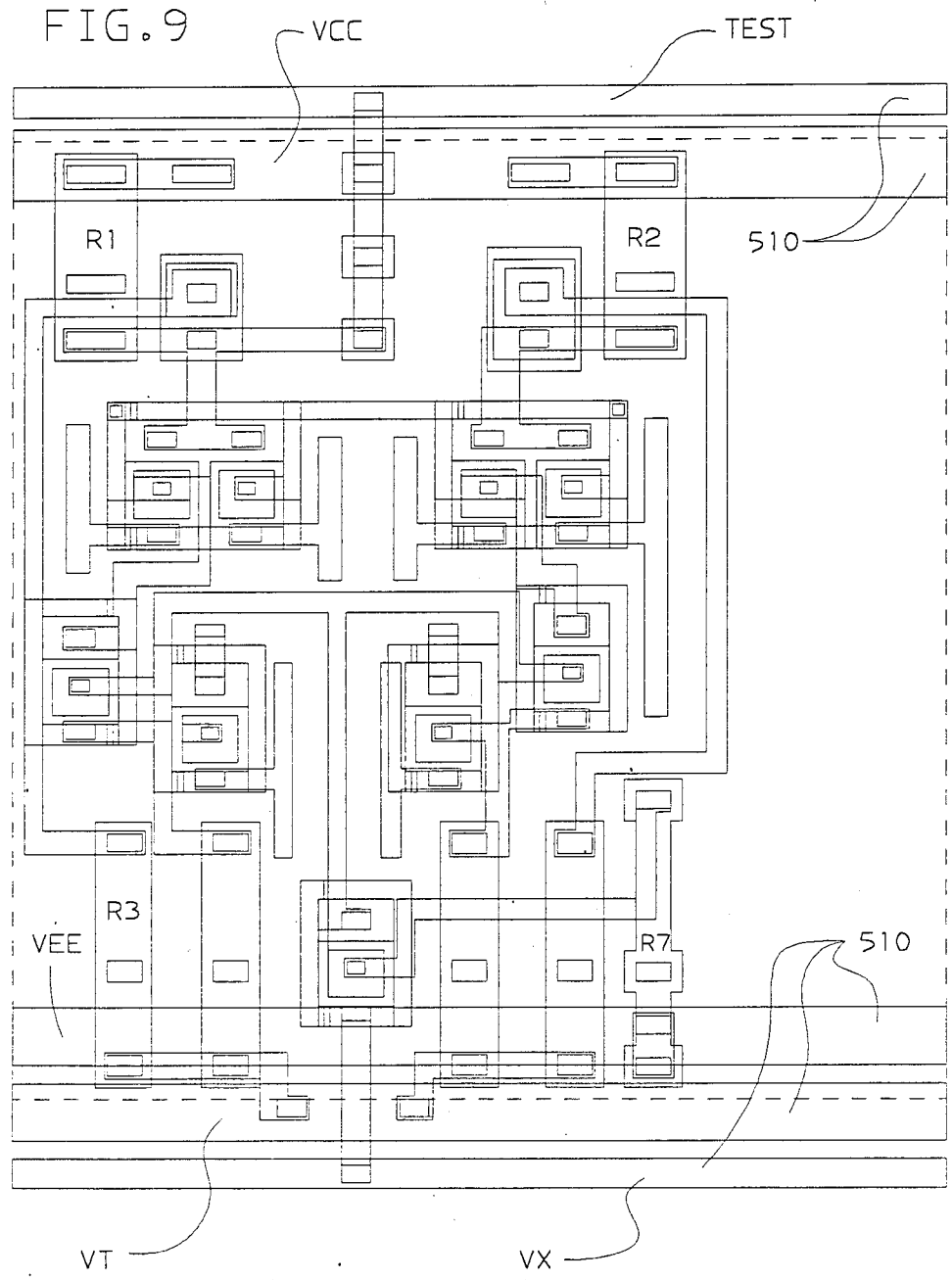
FIG. 9 is the cell shown in FIG. 8, with second level power buss metallization.

FIG. 8 is a diagram showing the first level metallization 500 applied to the cell 10 of FIG. 1 required to form the two-way selector depicted in FIG. 6. Note that a single second level wire 50, is required to complete the circuit. FIG. 9 shows additional second level metallization 510 required for power connection. It will be understood that additional metallization is required for interconnection of the cell shown in FIG. 9 with other cells on a chip. The provision of such metallization is well within the scope of one of ordinary skill in this art.

4. Four-Way Selector

Figure 10:
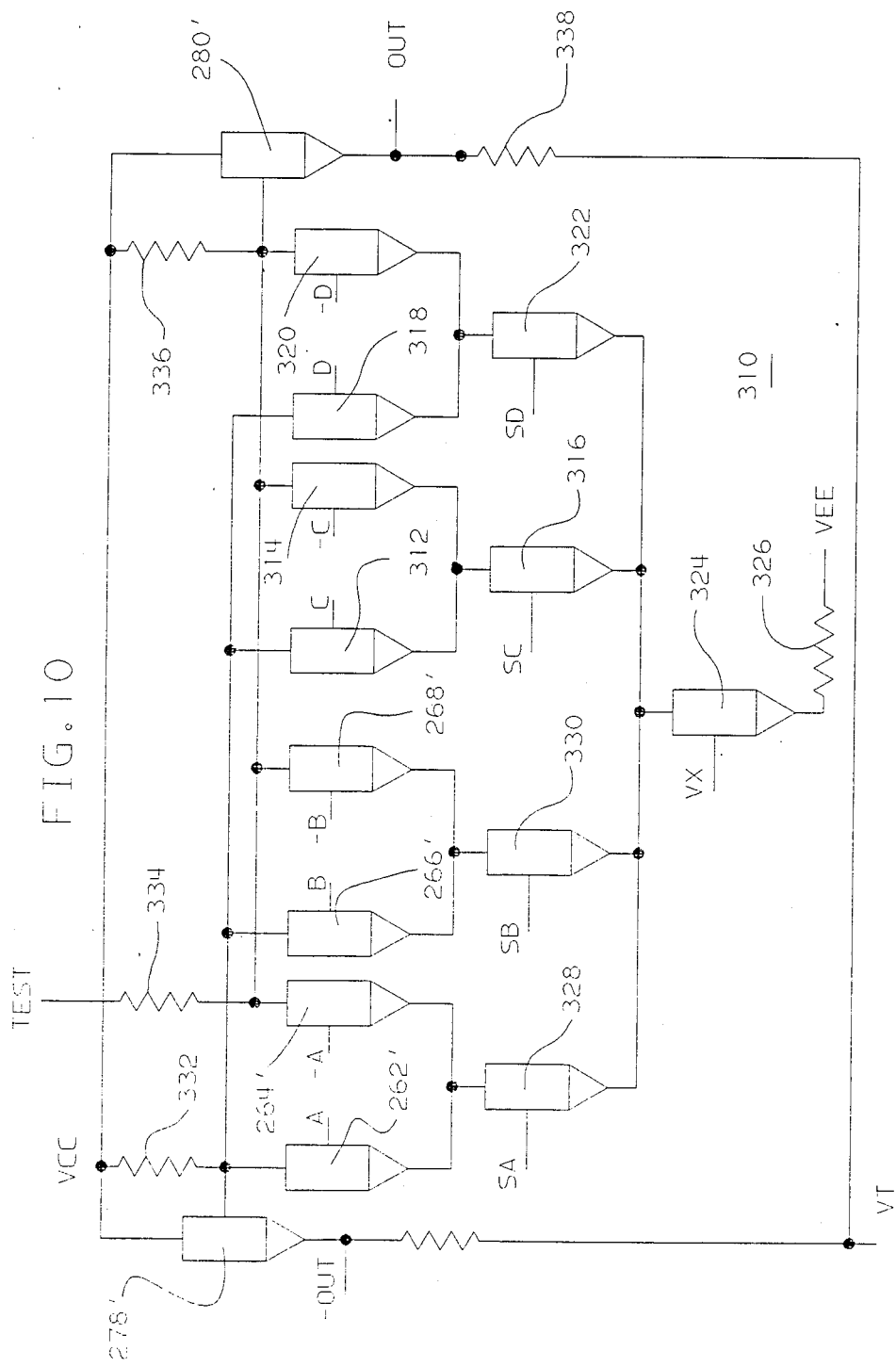
FIG. 10 is a circuit diagram for a four-way select circuit.

An example of a four-way selector is shown in FIG. 10. Additional transistor triads 312, 314, 316, and 318, 320, 322, which provide the additional inputs over the two way selector circuit 260 of FIG. 10 can be seen. Thus, the current from a single current source transistor 324) is steered through one of four transistors (transistors 328, 330, 316, 322) depending on which of their gates is positive (one and only one gate signal must be positive). The output is then determined by the data input corresponding to the positive gate signal. This circuit has many applications in the data flow areas and requires only one current source. The number of inputs is only limited by leakage and delay effects and can be quite large.

Figure 11:
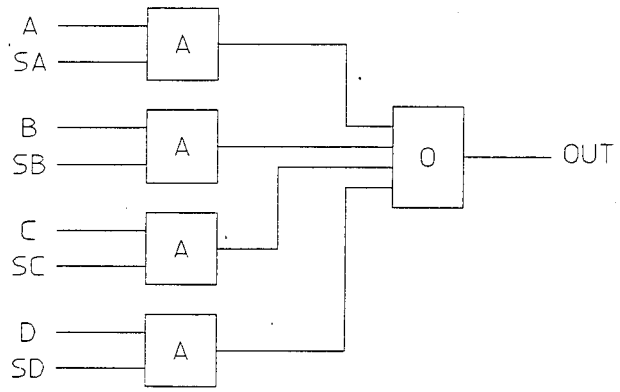
FIG. 11 is a logic diagram for the circuit shown in FIG. 10.

A logic model for the four way select circuit 310 of FIG. 10 is shown in FIG. 11. The OUT signal equals A(SA)+B(SB)+C(SC)+D(SD).

5. L1 Latch

A DCCS L1 latch is shown in FIG. 12. When clock line Cg1 is "on" (positive) the current, $I_O$, flows through transistor 102 and then through transistor 110 or 112 depending on whether +D is positive or negative. Thus, the value of the data inputs (+D, −D) determine the value of the data outputs (+L1, −L1). As clock Cg1 turns "off" (−) and HOLD turns "on" the current begins to flow through transistor 104 and through either transistor 114 or 116 depending on whether +L is positive or negative. During this transition, the state of the outputs data (+L, −L) remains unchanged and the input data is stored in the latch. With the clock "off" the data input (+D, −D) cannot change the state of the latch.

As mentioned earlier, the clock input to the latch is always a lower level DCCS signal, so an input emitter follower is not required to shift the level of the DCCS signal.

As can be seen in FIG. 12, the latch contains fewer components than a conventional ECL latch, requires only one current source, and has only one stage of delay. These latch attributes are an advantage that the present invention provides over prior art masterslice circuit designs, and they allow implementation of fast, low powered data flows that are relatively compact in silicon area.

Note also that a transistor pair 108, 122, 124 is included to provide a latch scan function useful in chip testing.

Figure 13:
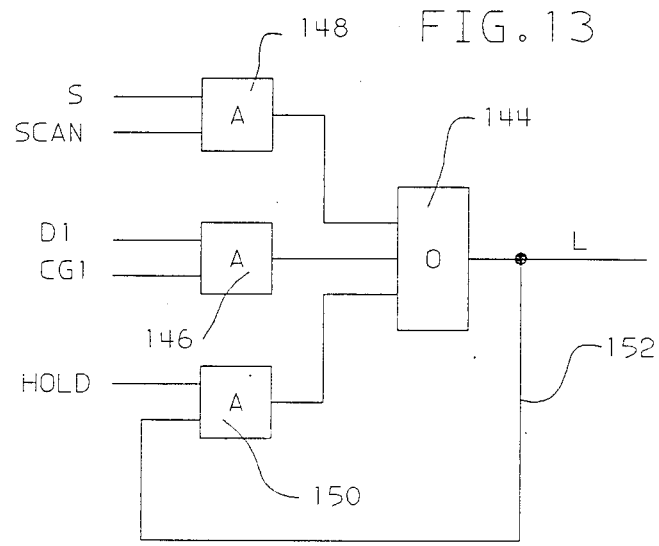
FIG. 13 is a logic diagram for the circuit shown in FIG. 12.

FIG. 13 illustrates the logic function of the latch of FIG. 12.

6. L1 Clock Driver

Figure 14A:
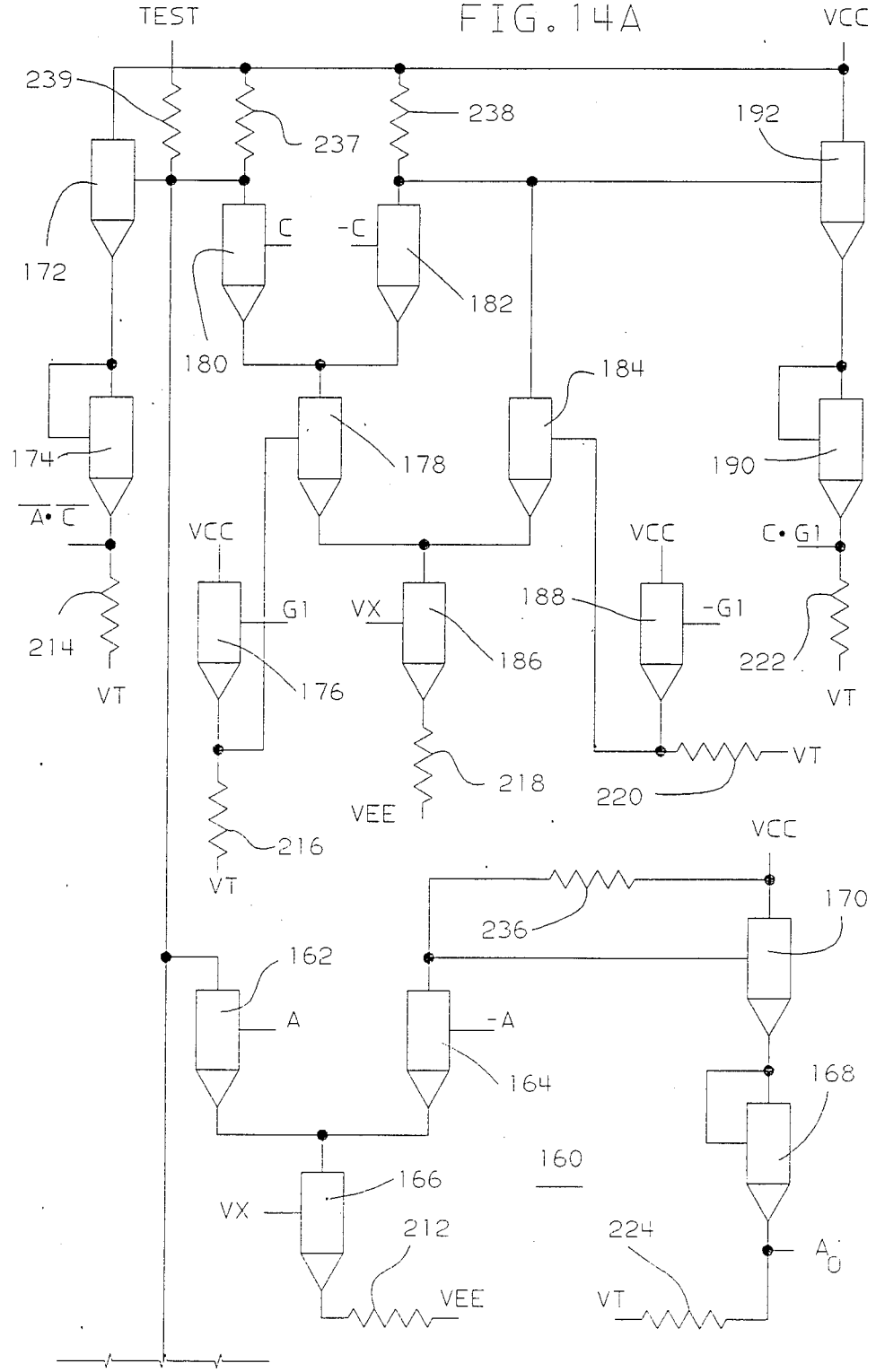
FIG. 14 is a circuit diagram for an L1 clock driver.
Figure 14B:
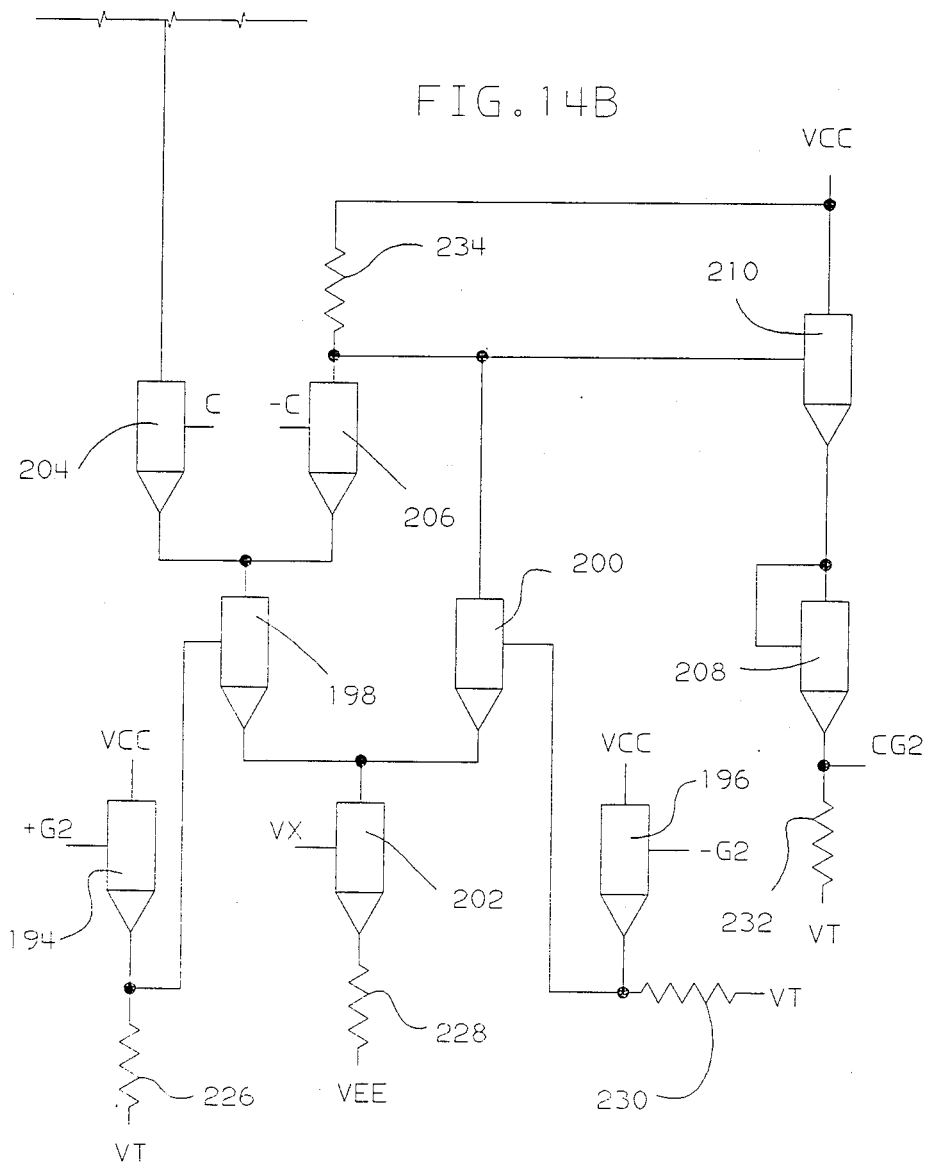

FIG. 14 is a schematic diagram of an L1 clock driver, for example for the 2-port L1 latch of FIG. 12.

By restricting the system clocks A and C be orthogonal, i.e., only one can be on at a time, the L1 clock driver outputs will be orthogonal which is required for the L1 latch.

Figure 15:
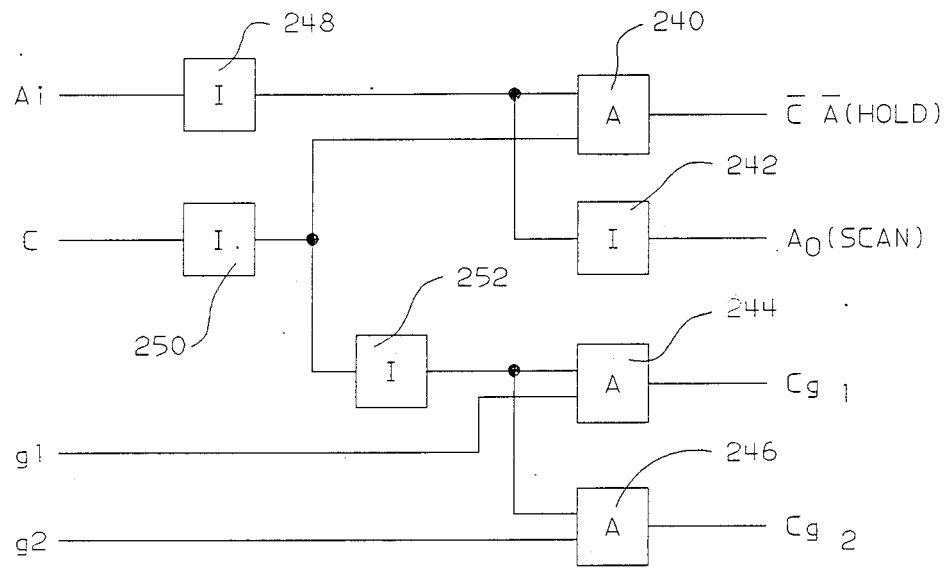
FIG. 15 is a logic diagram for the circuit shown in FIG. 14.

FIG. 15 is a logic diagram for the circuit of FIG. 14. As shown by the diagram of FIG. 15, the L1 clock driver provides a CA, or HOLD, signal, a buffered A output, $A_O$, a Cg1 and a Cg2 signal. Signals Cg1 and Cg2 are clock signals having the leading and trailing edges shaped by clock C, and having a level controlled by input signals $g_1$ and $g_2$.

The logic elements depicted in FIG. 15 can be related to the circuit elements depicted in FIG. 14. Thus, AND gate 246 (FIG. 15) is implemented by way of transistors 194, 196, 198, 200, 202, 204, and 206 (FIG. 14). Transistor 208 is a voltage translator to the lower level voltage for output signals Cg2.

AND gate 244 (FIG. 15) is implemented by way of transistors 176, 178, 180, 182, 184, 186, 188, 190 and 192 (FIG. 14). AND gate 240 (FIG. 15) is implemented by way of transistors 162, 164 and 166 (FIG. 14). Another voltage translator is provided by way of transistor 174.

Input voltage translators are provided by way of transistors 176, 188, 194 and 196.

7. N-Way Selector Driver

Figure 16A:
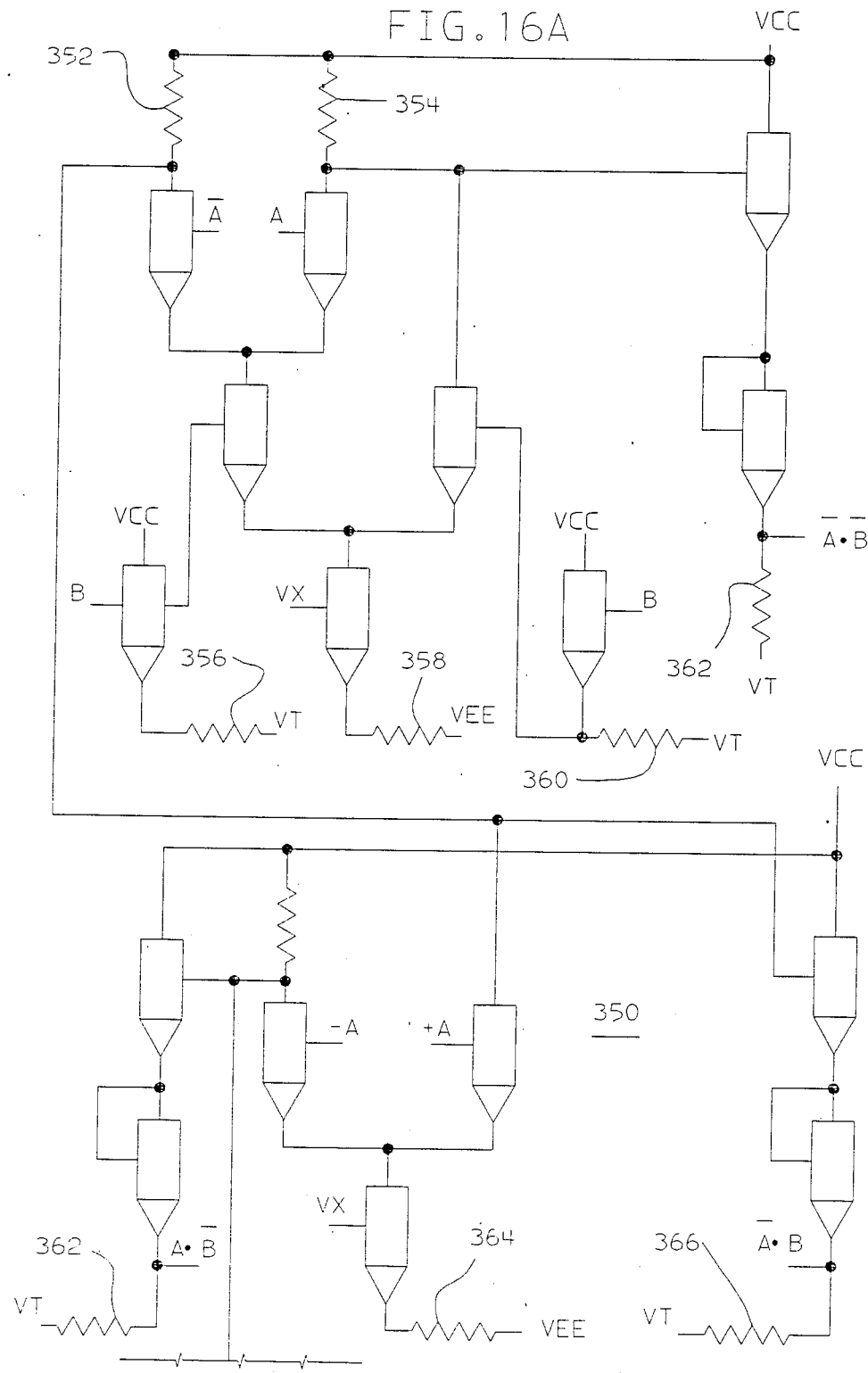
FIG. 16 is a circuit diagram for a four-way selector driver.

To assure proper operation of an N-way selector it must be driven from an N-way gate driver which provides in low level gate signals, where at any given time only one is positive and the rest are negative. A gate driver for a four way selector gate driver is shown in FIG. 16. Its structure and operation is similar to the clock driver 160 (FIG. 14), except that all four combinations of the input signals A and B are allowed.

In general, an N-way gate driver requires N-1 internal current sources plus N emitter followers. For N-port gate drivers, where N is greater than 4, multi-level logic decode is required.

Figure 17:
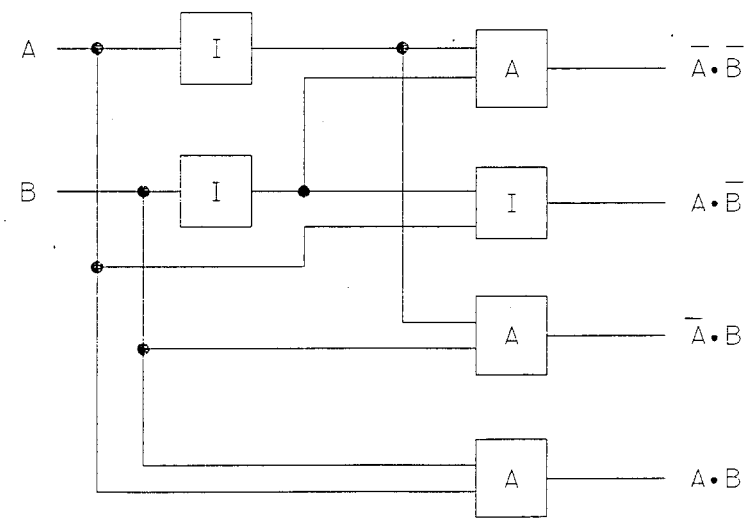
FIG. 17 is a logic diagram for the circuit shown in FIG. 16.

A logic model for driver 350 is shown in FIG. 17.

Although all necessary logic functions can be implemented with the circuits described above, several additional circuits are described below which simplify chip wiring in specific instances.

8. Internal Gated Buss Driver

Figure 19:
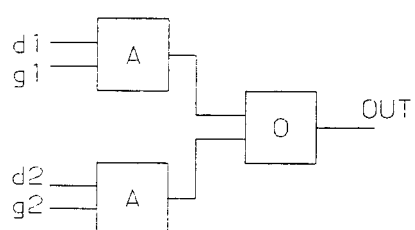
FIG. 19 is a logic diagram for the circuit shown in FIG. 18.
Figure 18A:
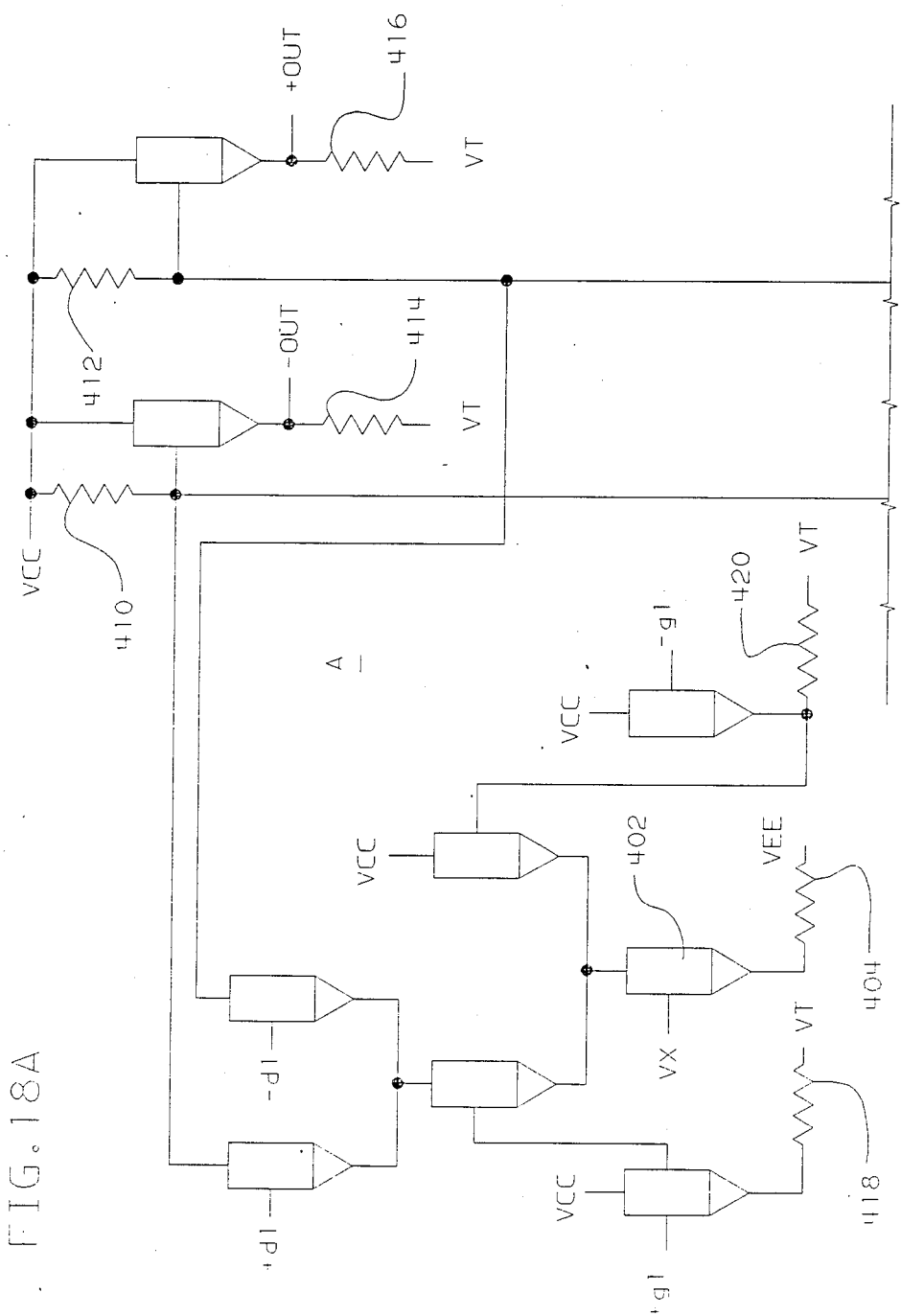
FIG. 18 is a circuit diagram of an internal gated buss driver.
Figure 18B:
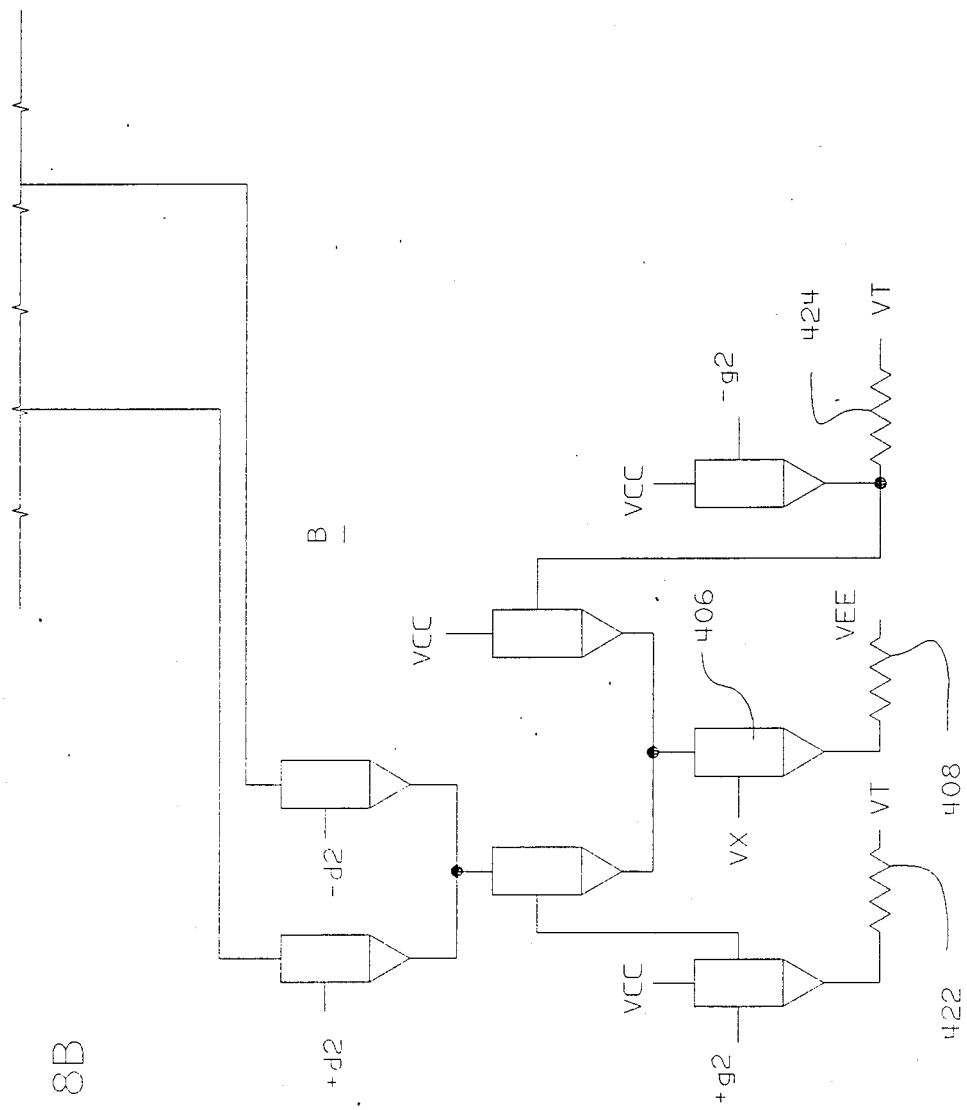

Although selectors can be used to provide two-way communication function in data flow, the internal gated buss driver greatly simplifies chip wiring. Such a buss driver is shown in FIG. 18. Its logic model is shown in FIG. 19.

A two-input gated Buss driver is shown. Each driver has a single current source 402, 404 and 406, 408, and can be dotted to an internal DCS buss with load resistors 410 and 412. The DCS buss can, of course, drive other DCS circuits. At any given time exactly one of the n gates must by "on" (plus $g_1$ positive and $-g_1$ negative). The circuit designer must be sure that the logic generating these n gates be so designed that for all possible input combinations, one and only one gate is "on". It is recommended that this be accomplished by designing either logic or physical macros using standard DCS logic circuits. The data input signals are standard high-level DCS signals, while the gate inputs are low-level DCS signals and can also be obtained from a high level signal by the emitter followers.

9. Off Chip Receiver Circuit

Figure 20:
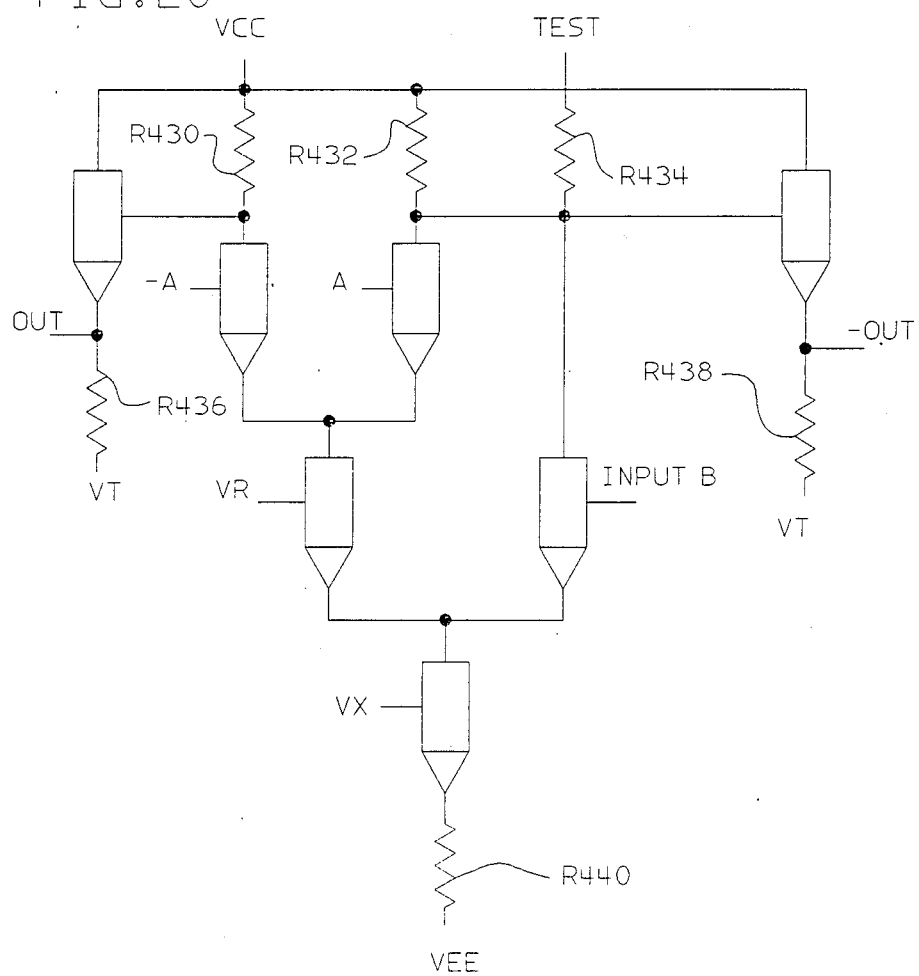
FIG. 20 is a circuit diagram for an off-chip receiver circuit.
Figure 21:
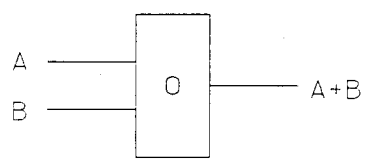
FIG. 21 is a logic diagram for the circuit shown in FIG. 20.

An Off Chip Receiver Circuit, shown in FIG. 20, converts ECL logic level signals to DCCS level signals. In addition, it can be used to perform an OR function between an external, ECL signal and an internal, DCCS signal. Its logic diagram is shown in FIG. 21. The external input signal is B, while the internal input signal is A.

C. Dot Function Connections

Figure 23:
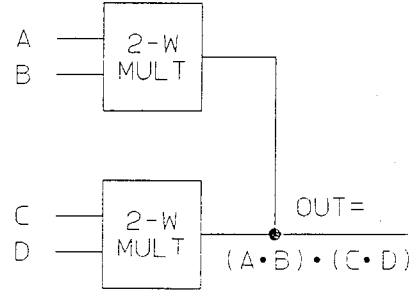
FIG. 23 is a logic diagram for the circuit shown in FIG. 22.
Figure 22A:
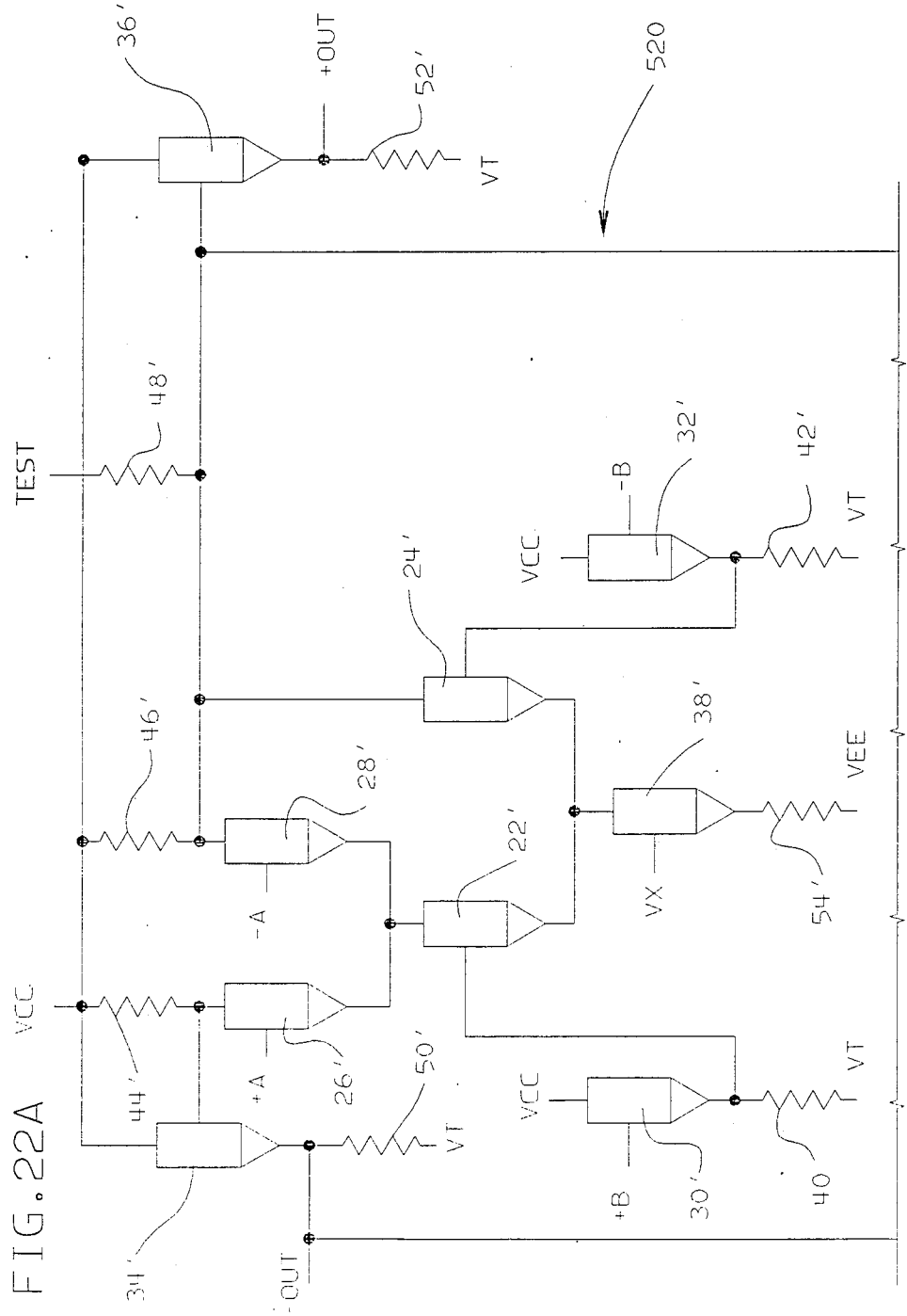
FIG. 22 is a circuit diagram showing the dotting of two two-way multi-function circuits.

Larger, more complex circuit configurations may be obtained by dotting two or more of the above-described logic primitives, in accordance with conventional dotting techniques. FIG. 22 is a circuit diagram and FIG. 23 is a logic diagram for that circuit, of one such composite circuit. It illustrates the AND dotting of two of the multi-function two-input circuits shown in FIG. 2. The two circuits 520, 522 are AND dotted at their plus outputs, and OR dotted at their negative outputs, as shown. Other dot combinations may be made according to well-known techniques, once the basic principles of the present invention described herein are understood.

D. Test Port

In each of the above circuit diagrams for the logic primitives, a test port is shown. This port provides a means for applying a bias to a selected one of the output signal lines. This permits the bias voltage to one side of the output circuit to be varied slightly about a nominal value, to expose marginally valid outputs caused by defective components. During normal operation, this port is simply tied to $V_{CC}$. This is a highly cost effective test implementation, requiring only one additional resistor. It also has a minimal impact on performance. Other test schemes may be employed, for example to maximize the reliability of the test. Such expedients are within the scope of one having ordinary skill in this art, once the principles of the present invention, as herein described, are understood.

TABLE I

| | | |
|---|---|---|
| | FIG. 2 | |
| R40,42 | | 1,421 ohm |
| R44,46 | | 277 ohm |
| R48 | | 2,878 ohm |
| R50,52 | | 1,421 ohm |
| R54 | | 954 ohm |
| | FIG. 4 | |
| R84,86 | | 1,421 ohm |
| R88,90 | | 277 ohm |
| R92 | | 2,878 ohm |
| R94,96 | | 1,421 ohm |
| R98 | | 954 ohm |
| | FIG. 6 | |
| R284,286 | | 277 ohm |
| R288 | | 2,878 ohm |
| R290,292,294,296 | | 1,421 ohm |
| R298 | | 954 ohm |
| | FIG. 10 | |
| R326 | | 954 ohm |
| R332 | | 277 ohm |
| R334 | | 2,878 ohm |
| R336 | | 277 ohm |
| R337,338 | | 1,421 ohm |
| | FIG. 12 | |
| R128 | | 954 ohm |
| R130,132 | | 277 ohm |
| | FIG. 14 | |
| R214 | | 583 ohm |
| R216 | | 1,421 ohm |
| R218 | | 954 ohm |
| R220 | | 1,421 ohm |
| R222,224 | | 582 ohm |
| R226 | | 1,421 ohm |
| R228 | | 954 ohm |
| R230 | | 1,421 ohm |
| R232 | | 583 ohm |
| | FIG. 16 | |
| R352,354 | | 277 ohm |
| R356 | | 1,421 ohm |
| R358 | | 954 ohm |
| R360 | | 1,421 ohm |
| R362 | | 583 ohm |

TABLE I-continued

| | |
|---|---|
| R364 | 954 ohm |
| R366 | 364 ohm |
| R368 | 277 ohm |
| R370 | 2,878 ohm |
| R372 | 1,421 ohm |
| R374 | 954 ohm |
| R376 | 1,421 ohm |
| R378 | 583 ohm |
| FIG. 18 | |
| R404,408 | 954 ohm |
| R410,412 | 277 ohm |
| R414,416,418,420,422,424 | 1,421 ohm |
| FIG. 20 | |
| R430,432 | 277 ohm |
| R434 | 2,878 ohm |
| R436,438 | 1,421 ohm |
| R440 | 954 ohm |

Thus, while the invention has been described with reference to preferred embodiments thereof, it will be understood by those skilled in the art that various changes in form and details may be made without departing from the scope of the invention.

What is claimed is:

1. In a masterslice design system, a cell for replicated placement in an array on a semiconductor chip for subsequent wiring to form a VLSI circuit comprising:
   a plurality of devices arranged so as to permit interconnection by wiring to form any of a set of basic logic circuits for interconnection with other such wired cells on the same chip to form a larger circuit, said basic logic circuits being of the two level differential cascode current switch type;
   said devices being further arranged so as to permit at least one pair of said devices to be wired to form an input translator circuit;
   said plurality of devices including device characteristics selected to provide a signal swing having a magnitude of approximately 200 millivolts (mv) or less.

2. A cell according to claim 1, wherein a substantial portion of the cell area contains no devices, whereby first level metallization global wiring may be routed thereover.

3. A cell according to claim 1, wherein said devices are arranged so as to be interconnected with substantially a single level of metallization to form any one of the following differential cascode current switch circuits:
   a two-way multi-function circuit,
   a two-way exclusive OR circuit,
   a two-way selector circuit,
   a latch,
   a clock driver,
   a driver circuit for a two-way selector circuit, or
   an internal gated buss driver.

* * * * *